(12) United States Patent
Nam et al.

(10) Patent No.: US 11,176,985 B1
(45) Date of Patent: Nov. 16, 2021

(54) BOUNDARY PROTECTION IN MEMORY (71) Applicant: Micron Technology, Inc., Boise, ID (US)

(72) Inventors: Ki-Jun Nam, Boise, ID (US); Hiroshi Akamatsu, Boise, ID (US); Takamasa Suzuki, Tokyo (JP); Yasushi Matsubara, Isehara (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/925,057

(22) Filed: Jul. 9, 2020

(51) Int. Cl.
*G11C 11/22* (2006.01)
*G11C 11/4074* (2006.01)
*G06F 11/30* (2006.01)
*G11C 5/14* (2006.01)

(52) U.S. Cl.
CPC ...... *G11C 11/2297* (2013.01); *G06F 11/3034* (2013.01); *G06F 11/3058* (2013.01); *G11C 11/4074* (2013.01); *G11C 5/14* (2013.01); *G11C 5/144* (2013.01); *G11C 5/148* (2013.01)

(58) Field of Classification Search
CPC ......... G11C 11/2297; G11C 5/14; G11C 5/44; G11C 5/148; G11C 11/4074
See application file for complete search history.

(56) References Cited

U.S. PATENT DOCUMENTS

| | | | |
|---|---|---|---|
| 5,583,457 A * | 12/1996 | Horiguchi | G06F 1/3203 326/121 |
| 7,099,234 B2 | 8/2006 | Parris et al. | |
| 8,248,789 B2 | 8/2012 | Wu et al. | |
| 8,413,007 B2 | 4/2013 | Pawlowski et al. | |
| 10,097,181 B2 | 10/2018 | Arai | |
| 10,141,932 B1 | 11/2018 | Sato | |
| 10,410,710 B2 | 9/2019 | Lee | |
| 2011/0254617 A1 * | 10/2011 | Ishii | G11C 5/06 327/543 |
| 2013/0027413 A1 | 1/2013 | Jayavant et al. | |
| 2020/0057485 A1 | 2/2020 | Chiang et al. | |
| 2020/0126611 A1 | 4/2020 | Riho et al. | |

OTHER PUBLICATIONS

Oza, et al., "Techniques for Sub-threshold Leakage Reduction in Low Power CMOS Circuit Designs", International Journal of Computer Applications, vol. 97—No. 15, Jul. 2014, 4 pages.

* cited by examiner

*Primary Examiner* — Han Yang
(74) *Attorney, Agent, or Firm* — Brooks, Cameron & Huebsch, PLLC (57) ABSTRACT

Apparatuses and methods related to power domain boundary protection in memory. A number of embodiments can include using a voltage detector to monitor a floating power supply voltage used to power a number of logic components while a memory device operates in a reduced power mode, and responsive to the voltage detector detecting that the floating power supply voltage reaches a threshold value while the memory device is in the reduced power mode, providing a control signal to protection logic to prevent a floating output signal driven from one or more of the logic components from being provided across a power domain boundary to one or more of a different number of logic components.

20 Claims, 9 Drawing Sheets

BOUNDARY PROTECTION IN MEMORY

TECHNICAL FIELD

The present disclosure relates generally to memory, and more particularly to apparatuses and methods associated with boundary protection in memory.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, ferroelectric random access memory (FeRAM), and resistance variable memory such as phase change random access memory (PCRAM), resistive random access memory (RRAM), and magnetoresistive random access memory (MRAM), such as spin torque transfer random access memory (STT RAM), among others.

Memory devices are often configured to operate in one or more different power modes, which may include one or more reduced power modes referred to as power down modes, standby modes, and/or sleep modes. Such reduced power modes can provide benefits such as conserving power during idle time of the memory device. As an example, a memory device may be configured to operate in a number of different reduced power modes. Each different power mode can correspond to a particular standby current amount, which can be measure of the amount of current (IDD) drawn by the device at an external supply voltage (VDD) terminal of the device.

DETAILED DESCRIPTION

The present disclosure includes apparatuses and methods related to power domain boundary protection in memory. Various memory devices such as FeRAM memory devices, DRAM memory devices, etc., can be operated in different power modes in order to conserve power during idle time of the device. In various reduced power modes, power to particular logic components of the memory device can be turned off to reduce standby current. The extent to which standby current can be reduced can depend on various factors. For instance, various volatile memory devices may require a higher amount of standby current in sleep modes than nonvolatile memory devices in order to guarantee data retention during sleep modes. Many memory devices also include fuse data which can be lost if the power supply voltage provided to the latches drops below a particular level.

One way to reduce standby current in a particular reduced power mode is to turn off power to a particular group of logic components upon entering the particular reduced power mode. The power supply voltage provided to the particular group of logic components can be referred to herein as "VPD," which is an internal local power supply that is connected to an external power supply voltage (e.g., VDD2) when the memory device is not in the particular reduced power mode. As an example, the particular reduced power mode can be a deep sleep mode, which can be the sleep mode the device corresponding to a lowest standby current. When the memory device is in a power mode other than the deep sleep mode (e.g., a normal power mode or a different sleep mode having a higher corresponding standby current), VPD is connected to VDD2 via a switch. However, upon entering the particular reduced power mode (e.g., deep sleep mode), the switch can be disabled (turned off) leaving VPD disconnected from VDD2 and floating. If the memory device is in the particular reduced power mode long enough, VPD will collapse toward a ground voltage VSS.

Floating VPD in the deep sleep mode creates a power domain boundary between the VPD domain and the VDD2 domain. For example, the particular group of logic components in the VPD domain can drive floating output signals that are provided as inputs to logic components in the VDD2 domain. Since the transition period of VPD from the VPD voltage to VSS is not short, the floating inputs provided to the logic components in the VDD2 domain leads to undesirable current flow (e.g., "crowbar current") in VDD2 logic components such as inverters.

As described further herein, a number of embodiments of the present disclosure can provide protection of the boundary by reducing and/or preventing floating signals from creating unnecessary current flow in the external power domain (e.g., VDD2). As an example, a number of embodiments include a voltage detector configured to monitor the VPD voltage when the device is in the particular reduced power mode (e.g., deep sleep mode). The VPD detector can provide status information associated with the floating VPD supply voltage while the device is in the reduced power mode and during exit (e.g., recovery). Responsive to the floating voltage being determined to reach a threshold value during the reduced power mode, protection signals (e.g., flags) can be provided to protection logic, and the protection logic can be released in association with reduced power mode exit. For timing critical signals driven by sub-threshold current reduction circuit (SCRC) logic, a damper device, which can be a single transistor, can be used to clamp the SCRC output node to VSS. The gate of the damper transistor can be controlled by a protection flag based on the output of the VPD detector. As described further herein, utilizing a damper transistor can provide benefits such as avoiding timing penalties and area penalties that can be associated with using NAND/NOR logic gates, for example. A number of embodiments include, during deep sleep mode exit, performing a rebroadcast of fuse data to recover data that may have been lost from fuse latches due to the floating of VPD.

As used herein, "a number of" something can refer to one or more of such things. For example, a number of memory devices can refer to one or more memory devices. A "plurality" of something intends two or more. As used herein, the designator "N," particularly with respect to reference numerals in the drawings, indicates that a number of the particular feature so designated can be included.

The figures herein follow a numbering convention in which the first digit or digits correspond to the drawing figure number and the remaining digits identify an element or component in the drawing. Similar elements or components between different figures may be identified by the use of similar digits. For example, element 124 may reference element "24" in FIG. 1, and a similar element may be referenced as element 524 in FIG. 5. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

Figure 1:
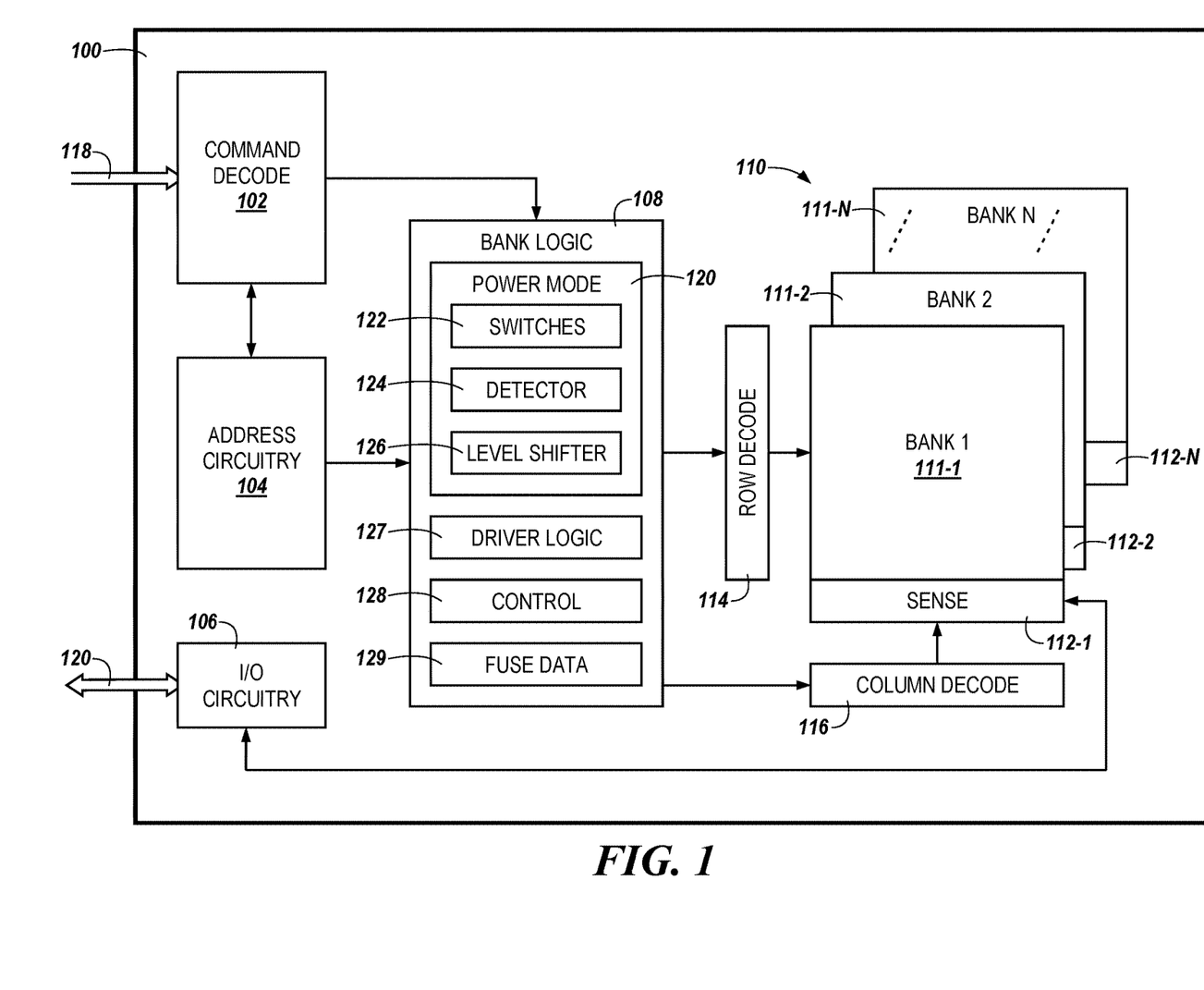
FIG. 1 is a block diagram of an apparatus in the form of a portion of a computing system including a memory device in accordance with a number of embodiments of the present disclosure.

FIG. 1 is a block diagram of an apparatus in the form of a portion of a computing system including a memory device 100 in accordance with a number of embodiments of the present disclosure. As used herein, a memory device 100, bank logic 108, memory 110, and/or detector 124, for example, might also be separately considered an "apparatus."

The memory device 110 can be, for example, a DRAM device or an FeRAM device; however, embodiments are not limited to a particular type of memory device. The memory device 100 can be coupled to a host within a computing system, which can be a personal laptop computer, a desktop computer, a digital camera, a mobile telephone, a memory card reader, or an Internet-of-Things (IoT) enabled device, among various other types of systems. The host can be coupled to the memory device 100 via interfaces 118 and 120. The interface 118 can be a combined command and address bus, and the interface 120 can be a data bus (e.g., an I/O bus). The host can comprise a number of processing resources (e.g., one or more processors) and can be, for example, a system controller of a memory system, which may be coupled to another processing resource such as a central processing unit (CPU).

For clarity, the memory device 100 has been simplified to focus on features with particular relevance to the present disclosure. The memory 110 can be an array such as a DRAM array, SRAM array, STT RAM array, PCRAM array, TRAM array, RRAM array, NAND flash array, and/or NOR flash array, for instance. As shown in FIG. 1, the memory 110 can be organized as a number of banks 111-1, 111-2, ..., 111-N of memory cells (referred to collectively as banks 111) arranged in rows coupled by access lines (which may be referred to herein as word lines or select lines) and columns coupled by sense lines (which may be referred to herein as digit lines or data lines).

The memory device 100 includes address circuitry 104 to latch address signals provided over an interface 118. The interface can include, for example, a physical interface employing a suitable protocol (e.g., a data bus, an address bus, and a command bus, or a combined data/address/command bus). Such protocol may be custom or proprietary, or the interface 118/120 may employ a standardized protocol, such as Peripheral Component Interconnect Express (PCIe), Gen-Z, CCIX, or the like. Address signals are received and decoded by a row decoder 114 and a column decoder 116 to access the memory 110. Data can be read from memory 110 by sensing voltage and/or current changes on the sense lines using sensing circuitry 112-1, 112-2, ..., 112-N (referred to collectively as sensing circuitry 112). The sensing circuitry 112 can comprise, for example, sense amplifiers that can read and latch a page (e.g., row) of data from the memory 110. The I/O circuitry 106 can be used for bi-directional data communication with a host over the interface 120. The memory device 100 includes a command decode component 102 configured to decode commands received via interface 118.

Bank logic 108 of memory device 100 can include various circuitry associated with operating device 100. In a number of embodiments, the bank logic 108 includes a power mode component that can comprise circuitry configured to operate the memory device 100 in accordance with various power modes and to switch between different power modes. Such power modes can include normal (e.g., active) operation modes which can involve reading/writing data from/to memory 110, as well as multiple reduced power modes. The reduced power modes can include various sleep modes corresponding to various levels of power reduction. As used herein, a deep sleep mode can refer to a sleep mode having a lowest associated standby current from among a number of available sleep modes. As shown in FIG. 1, the power mode circuitry 120 can include a number of switches 122 (e.g., HV switches), a voltage detector 124, and a level shifter 126 used in association with protecting power domain boundaries in accordance with embodiments of the present disclosure. Examples of the components 122, 124, and 126 are described in detail further herein below.

The bank logic 108 includes driver logic 127 which can include both SCRC driver logic and non-SCRC driver logic. As described further below, the particular type of driver logic 127 can determine the type of protection logic used in association with preventing undesirable current associated with driving floating signals across power domain boundaries in accordance with embodiments of the present disclosure. The bank logic 108 includes control circuitry 128 that can provide various control signals to logic components internal and external to bank logic 108 in association with performing operations of memory device 100. The control circuitry 128 can comprise a state machine, a sequencer, and/or some other type of control circuitry, which may be implemented in the form of hardware, firmware, or software, or any combination of the three.

The bank logic 108 can also include a number of fuse data latches 129 configured to store fuse data associated with operating the memory device 100. As described further herein, the fuse latches may be powered by an internal power supply (e.g., VPD) that can be floating during a reduced power mode. Accordingly, the fuse data stored in the latches 129 can be lost responsive to the power supply voltage dropping below a threshold value. As described further herein, the fuse data can be recovered via a rebroadcast of the fuse data to the latches during exit of the reduced power mode in accordance with various embodiments.

Although not shown in FIG. 1, the memory device 100 can include power supply terminals configured to receive external power supply voltages such as VDD1, VDD2, and VSS, with VDD1 being a relatively higher voltage than VDD2 and VSS being a ground potential. The external power supply voltages can be provided to various voltage regulators (not shown), which may be part of power mode circuitry 120 and which can be used to generate various different internal supply voltages used to power various logic components within memory device 100. For instance, as described herein, an internal supply voltage VPD can be used to power various logic components within the bank logic 108 for instance. Those logic components powered by VPD can be collectively referred to as the VPD power domain. In normal operation, VPD can be coupled to VDD2 via switches (e.g., 122/622). However, during a particular reduced power mode such as a deep sleep mode, the switches are turned off such that VPD is floating and begins to collapse toward VSS. When VPD is floating, a power domain boundary exists between the driver circuits of the VPD domain and those logic components of the VDD2 domain that receive floating output signals from the VPD logic. As described further herein, embodiments of the present disclosure provide circuitry and methods for protecting the boundary by preventing the floating VPD signals from causing increased standby current during a reduced power mode such as deep sleep mode. For example, a voltage detector 124 can monitor VPD, detect when VPD reaches a threshold value during the reduced power mode, and detect when VPD reaches a different threshold value in association with exiting the reduced power mode. The detection of the threshold values during the reduced power mode can trigger protection signals to protect the floating VPD signals from causing undesirable increased standby current due to power domain boundary crossings. In some embodiments in which the VPD driver circuitry comprises SCRC logic, a single clamping transistor (e.g., NMOS) can provide an effective protection logic by pulling down the SCRC output node (e.g., to VSS) responsive to a protection flag applied to its gate.

Figure 2A:
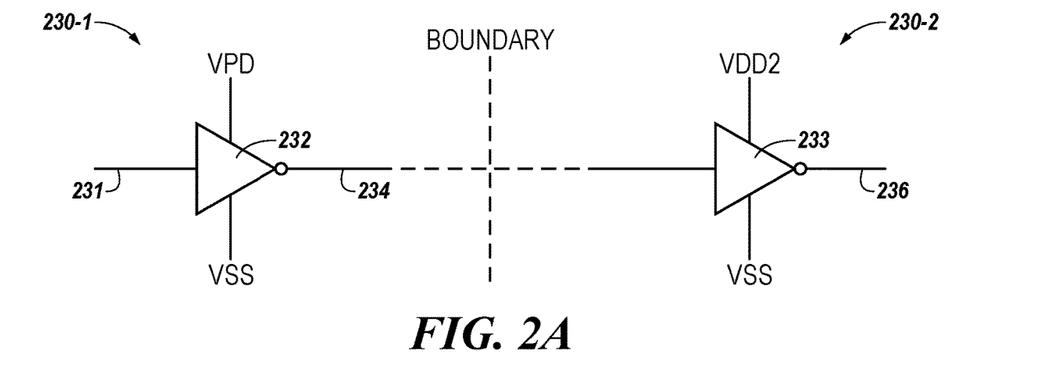
FIG. 2A illustrates logic components having different power sources in accordance with a number of embodiments of the present disclosure.
Figure 2B:
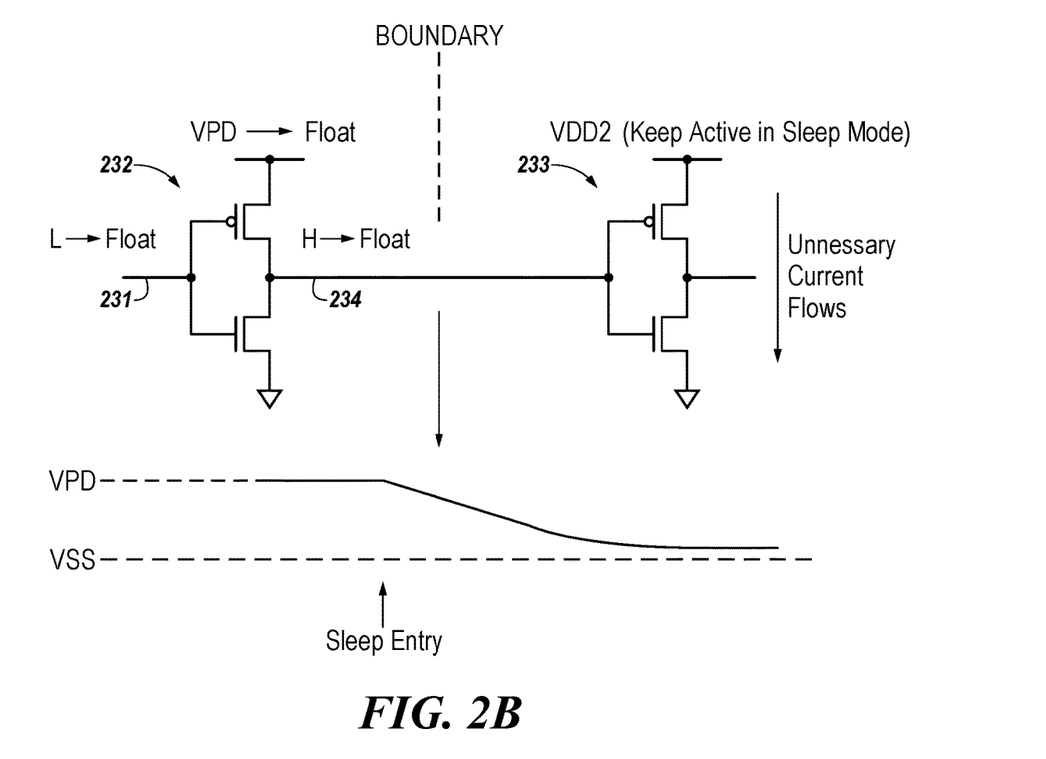
FIG. 2B illustrates a schematic corresponding to the logic components of FIG. 2A in accordance with a number of embodiments of the present disclosure.

FIG. 2A illustrates logic components having different power sources in accordance with a number of embodiments of the present disclosure. FIG. 2B illustrates a schematic corresponding to the logic components of FIG. 2A in accordance with a number of embodiments of the present disclosure. In this example, a power domain boundary exists between a first power domain 230-1 and a second power domain 230-2 because the inverters 232/233 use different power sources. For example, inverter 232 uses voltage VPD as a source and voltage VSS as a sink to drive signal 234, and inverter 233 uses voltage VDD2 as a source and VSS as a sink to drive signal 236. Signal 231 is input to inverter 232, which then drives output signal 234 as the input signal to inverter 233.

As an example, VDD2 can be an external power supply voltage and VSS can be a ground voltage. VPD can be a power down voltage as described further herein. In a number of embodiments, VPD can be a memory device internal local power supply used to power various logic components whose power is floated while the memory device is in a particular reduced power mode. As described further herein, VPD can be connected to VDD2 via a switch that is off when the device is in the reduced power mode.

As shown in FIG. 2B, the floated supply voltage VPD is gradually pulled to VSS after the reduced power mode (e.g., sleep mode) is entered. When VPD is floated, the signal 234 output from inverter 232 and input to inverter 233 is also floated. The floated input to inverter 233 can turn on the PMOS and NMOS transistors of inverter 233 at the same time, which leads to undesirable current flow in inverter 233 during the reduced power mode. Since it is desirable to reduce standby current while in a reduced power mode, it is beneficial to reduce or prevent the current flow in power domain 230-2 during the reduced power mode. Preventing or reducing current flow in logic components in one power domain (e.g., 230-2) due to receiving floating signals driven by logic components in a different power domain (e.g., 230-1) can be referred to as "protecting" the logic components or protecting the power domain boundary.

Figure 3:
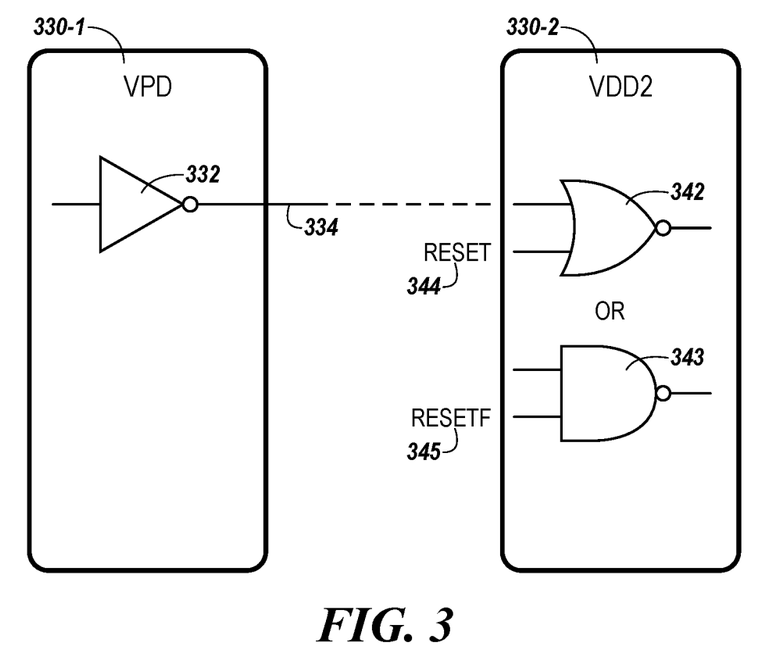
FIG. 3 illustrates an example of protection logic that can be used to reduce standby current in association with a reduced power mode in accordance with a number of embodiments of the present disclosure.
Figure 4:
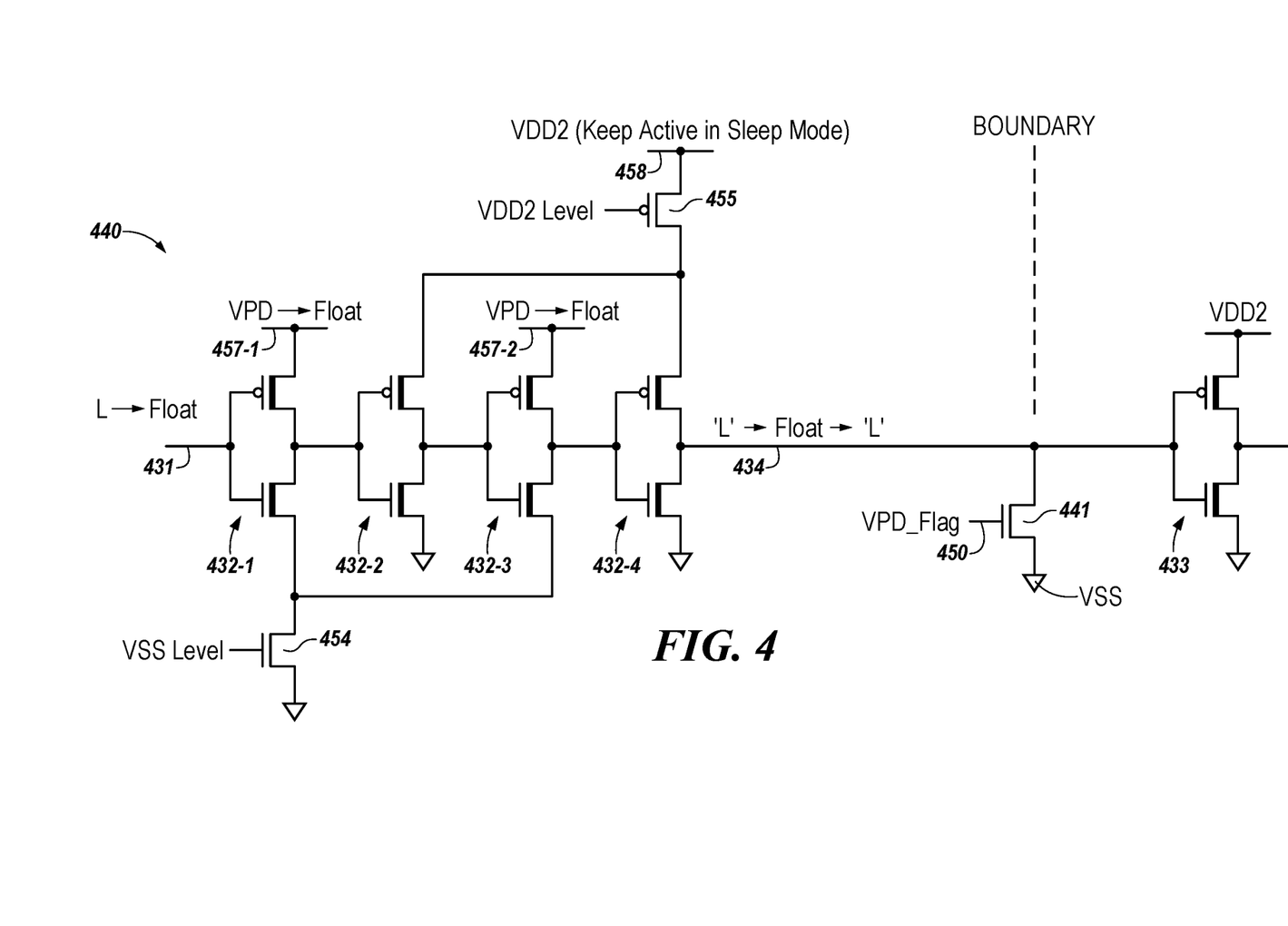
FIG. 4 illustrates an example of protection logic that can be used to reduce standby current in association with a reduced power mode in accordance with a number of embodiments of the present disclosure.

As described further in association with FIGS. 3 and 4, the manner in which the power domain boundary is protected can depend on the type of logic driving the floating signals from the VPD domain (e.g., 230-1) to the VDD2 valid power domain (e.g., 230-2). For example, in a number of embodiments of the present disclosure, the manner in which the boundary is protected depends on whether the circuitry driving the signals to the valid power domain is sub-threshold current reduction circuitry (SCRC) logic or non-SCRC logic. As used herein, SCRC logic, an example of which is described in FIG. 4, refers to circuitry configured to reduce subthreshold leakage current in a standby mode (e.g., an inactive state).

FIG. 3 illustrates an example of protection logic that can be used to reduce standby current in association with a reduced power mode in accordance with a number of embodiments of the present disclosure. In FIG. 3, logic gate 332 represents non-SCRC logic configured to drive a signal 334 from a reduced power mode domain 330-1 (shown as VPD) to a valid power domain 330-2 (shown as VDD2). In this example, the power domain boundary is protected by replacing an inverter (e.g., inverter 233 shown in FIGS. 2A/2B) with a two-input NOR gate 342 or a two-input NAND gate 343. That is, the gates 342/343 serve as protection logic. One of the inputs of the gates 342/343 receives the floating signal 334 from the VPD domain 330-1, and the other input of the gates 342/343 receives a protection flag 344 (RESET)/345 (RESETF). In a number of embodiments, the protection flags 344/345 can be enabled/disabled in response to the memory device entering/exiting a reduced power mode in which the internal supply voltage VPD is disconnected from the external power supply voltage VDD2. Alternatively, the protection flags 344/345 can be enabled responsive to a VPD voltage detector (e.g., voltage detector 124 described in FIG. 1 or voltage detector 524 described in FIG. 5) determining that the internal supply voltage VPD has dropped below first threshold value (e.g., first trip point of the detector) in association with entering the reduced power mode, and can be disabled responsive to the VPD voltage detector determining that the VPD voltage has increased above a second threshold value (e.g., second trip point of the detector) in association with exiting the reduced power mode.

Utilizing the logic gates 344 or 345 instead of inverter gates (e.g., 233) can reduce/prevent the unnecessary standby current during the reduced power mode; however, use of the logic gates 344/345 can have drawbacks such as area penalty since the gates 344/345 may comprise six or more transistors each. Additionally, the use of gates 344/345 can have an associated timing penalty, which may not be acceptable for timing critical signals.

FIG. 4 illustrates an example of protection logic that can be used to reduce standby current in association with a reduced power mode in accordance with a number of embodiments of the present disclosure. FIG. 4 includes an SCRC logic 440 in a first power domain configured to drive a signal 434 as an input to a logic component (e.g., an inverter 433) in a second power domain. As described above, when the memory device enters a reduced power mode, a power domain boundary exists between the logic component 440 powered by the internal floating supply voltage VPD and the logic component 433 powered by the external supply voltage VDD2. The SCRC logic 440 comprises a first switch 455 (e.g., header switch), a second switch 454 (e.g., footer switch), and a logic portion comprising a number of inverters 432-1, 432-2, 432-3, and 432-4 (collectively referred to as inverters 432). The transistors corresponding to the switches 454 and 455 are higher threshold voltage (Vt) transistors than those forming the inverters 432.

As illustrated in FIG. 4, in a reduced power mode, various nodes in the SCRC circuit 440 transition to floating voltages. For example, control signals are provided to the gates of the header and footer transistors 454 and 455 so as to turn them off such that supply node 458 is disconnected from inverters 432-2 and 432-4, and ground voltage VSS is disconnected from inverters 432-1 and 432-3. Additionally, switches such as switch 622 shown in FIG. 6 can be turned off to disconnect the internal supply voltage VPD from the external supply voltage VDD2, leaving VPD floating. For instance, nodes 457-1 and 457-2 transition from VPD to floating as shown. In this example, the input signal 431 of the SCRC circuit 440 transitions from a logic low ("L") to floating in the reduced power mode such that the output signal 434 driven by the SCRC logic 440 also transitions from logic low ("L") to floating.

However, in a number of embodiments, the boundary between the SCRC logic 440 located in the VPD power domain and the logic component 433 in the valid power domain is protected via a clamping device such as clamping transistor 441. In this example, the clamping device is a n-type (e.g., NMOS) pull down transistor 441. The gate of the clamping transistor 441 is controlled via a control signal 450 (VPD_flag). The control signal 450 can be configured to enable (e.g., turn on) the clamping transistor 441 responsive to the VPD voltage detector (e.g., 524 shown in FIG. 5) detecting that the VPD voltage has reached a threshold value (e.g., trip point 884-1 shown in FIG. 8A) during the reduced power mode in order to clamp the output 434 to VSS (e.g., logic low).

It can be beneficial to use a clamper 441 to protect the boundary between SCRC logic (e.g., 440) in the VPD power domain and logic in the valid power domain for various reasons. For example, replacing the logic 433 with NAND or NOR logic has the drawbacks of increased area and timing penalty as described above. Additionally, it can be beneficial for the SCRC driver 440 to be a "p" type driver whose output is logic low ("L") (e.g., VSS) as opposed to a "g" type driver whose output is logic high ("H") (e.g., VPD). For instance, clamping the output of "g" type SCRC driver to VPD using a PMOS damper would result in increased leakage current as compared to the "p" type driver and NMOS clamp to VSS.

Figure 5:
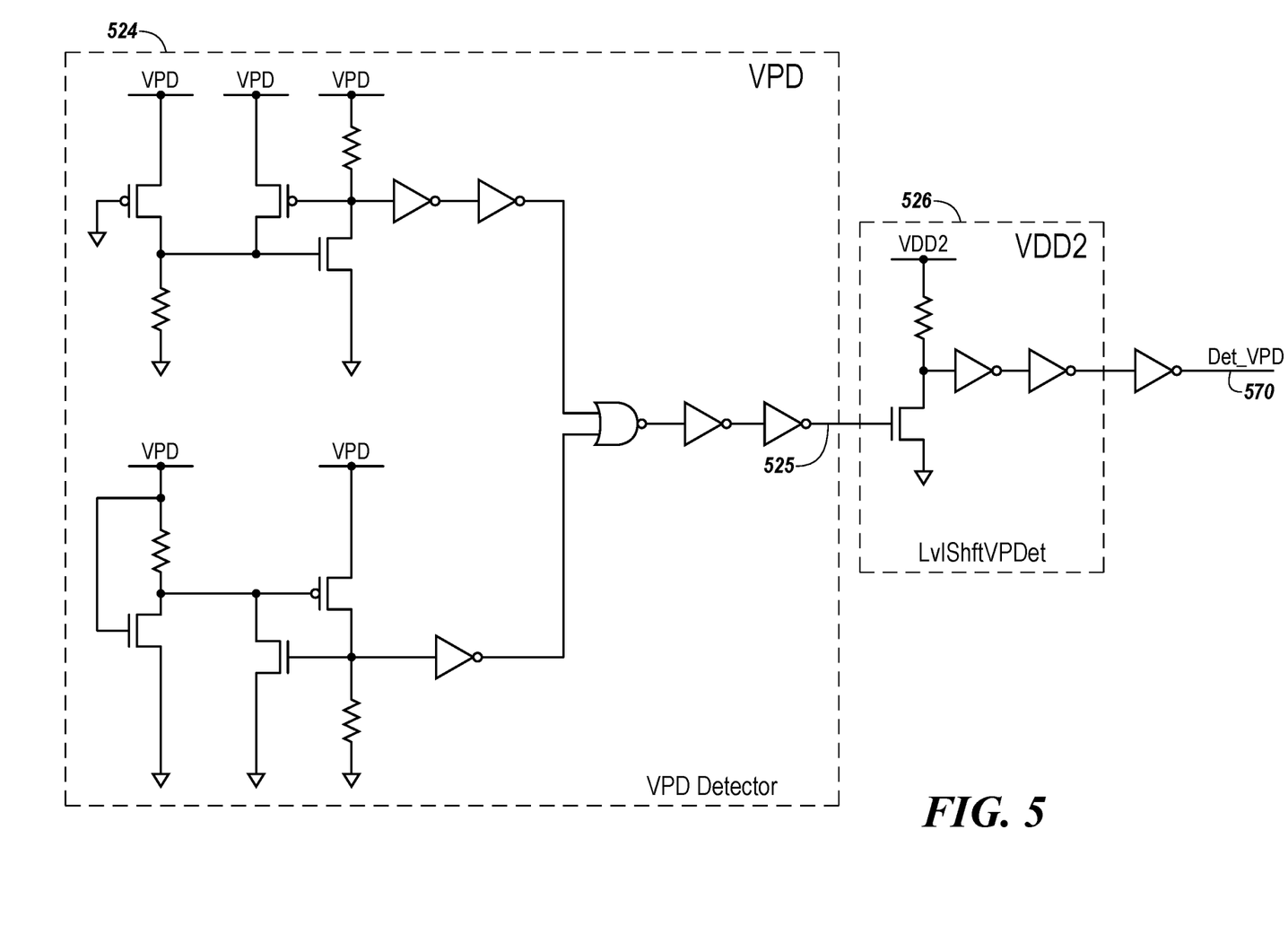
FIG. 5 is a schematic diagram illustrating an example of a voltage detector and a level shifter that can be used in association with boundary protection in accordance with a number of embodiments of the present disclosure.

FIG. 5 is a schematic diagram illustrating an example of a voltage detector 524 and a level shifter 526 that can be used in association with boundary protection in accordance with a number of embodiments of the present disclosure. The voltage detector 524 can be voltage detector such as voltage detector 124 described in FIG. 1. As shown in FIG. 5, the voltage detector 524 comprises a number of NMOS transistors, PMOS transistors, resistors, and logic gates (e.g., inverters and a NOR gate); however, embodiments are not so limited.

The voltage detector 524 is powered by the internal power supply VPD, which is connected to the external supply voltage VDD2 when the memory device is not in a reduced power mode, and is floating when the memory device is in the reduced power mode. As described further herein, the voltage detector 524 is configured to provide an indication at its output 525 when, during the reduced power mode, the floating supply voltage VPD drops below a particular threshold value. The voltage detector 524 is also configured to provide an indication at its output 525 in association with the VPD reaching another threshold value in association with exiting the reduced power mode.

In a number of embodiments, and as shown in FIG. 5, the output 525 of the voltage detector 524 can be provided as an input to a level shifter 526. The level shifter 526 is powered by the external supply voltage (e.g., VDD2) and can be used to deliver the detection information across the power domain boundary (e.g., from the VPD domain to the VDD2 domain). As an example, the output signal 570 (Det_VPD) of the level shifter can serve as the control signal provided to protection logic such as the protection logic described in FIGS. 3 and 4. Alternatively, the output signal 570 can be used to trigger other (e.g., different) control signals used to enable/disable protection logic in accordance with embodiments described herein.

Figure 6:
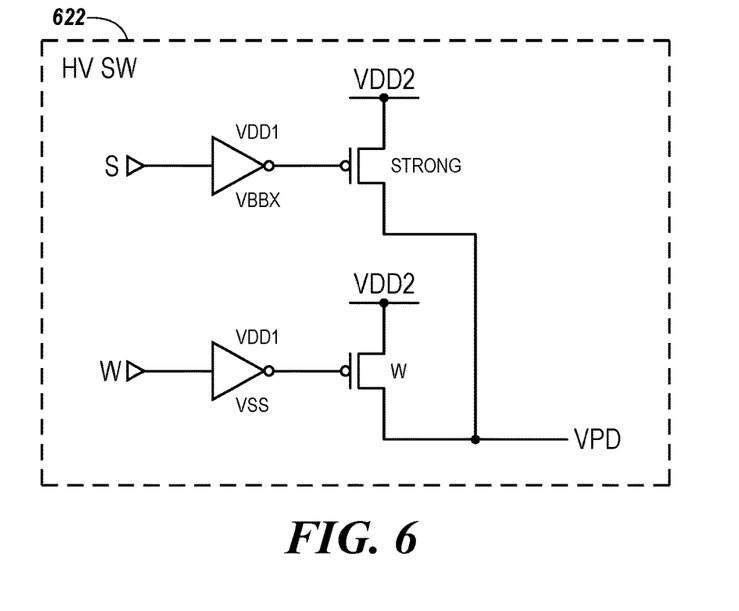
FIG. 6 is a schematic diagram illustrating an example of a switch that can be used in association with boundary protection in accordance with a number of embodiments of the present disclosure.

FIG. 6 is a schematic diagram illustrating an example of a switch 622 that can be used in association with boundary protection in accordance with a number of embodiments of the present disclosure. In normal operation of the memory device (e.g., in a non-reduced power mode), the internal local power (e.g., VPD) is connected to the external supply voltage (e.g., VDD2) via one or more of switches 622. That is, in normal mode, one or both of the strong driver transistor and the weak driver transistor are enabled such that VDD2 is connected to VPD. However, in association with the memory device transitioning from normal power mode to a reduced power mode (e.g., a deep sleep mode), the driver transistors can be disabled (e.g., turned off) such that the VPD node is left floating and begins to collapse toward VSS. During recovery of VPD (e.g., upon exit of the reduced power mode), VPD can be reconnected to VDD2 via the switch 622.

A number of embodiments can include use of multiple switches 622, which may be located at various locations within the memory devices, such as on a top and/or bottom side of a bank or bank group. In embodiments in which multiple switches (e.g., 622) are employed, the multiple switches can be controlled so as to reduce the peak current drawn. For example, the multiple switches can be turned on or off in a staggered manner by introducing some timing delay.

Figure 7:
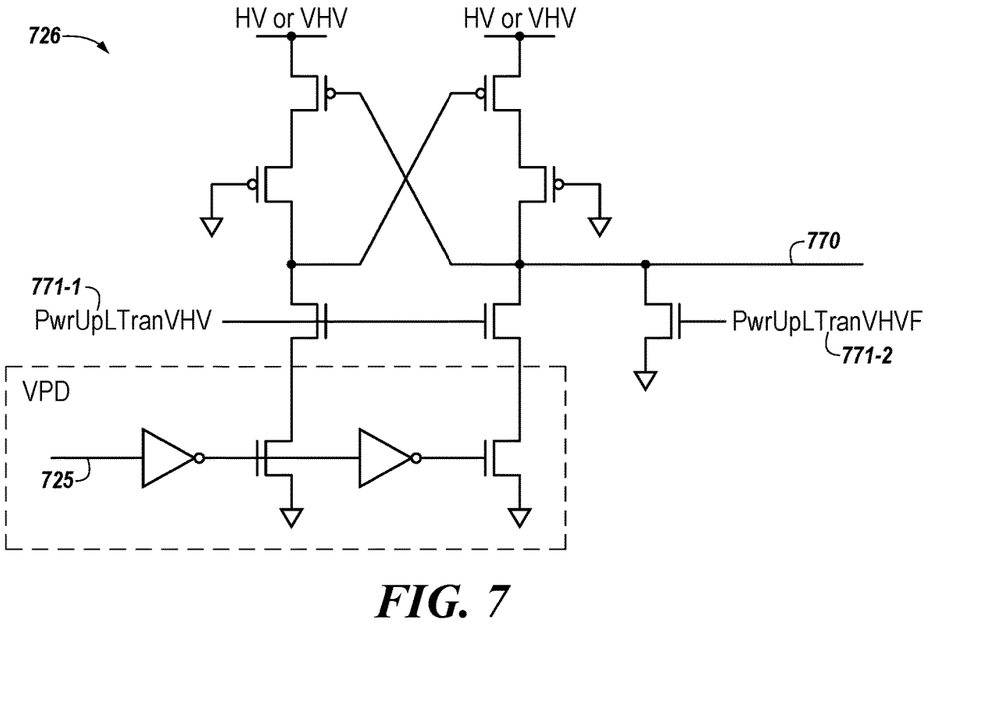
FIG. 7 is a schematic diagram illustrating an example of a level shifter that can be used in association with boundary protection in accordance with a number of embodiments of the present disclosure.

FIG. 7 is a schematic diagram illustrating an example of a level shifter 726 that can be used in association with boundary protection in accordance with a number of embodiments of the present disclosure. The level shifter 726 can operate similar to the level shifter 526 shown in FIG. 5. For example, the level shifter 726 is configured to receive signal 725 as input from a voltage detector such as voltage detector 524. The level shifter 726 can be a high voltage (HV) or very high voltage (VHV) level shifter; however, embodiments are not limited to a particular type of voltage shifter. In a number of embodiments, the level shifter includes isolation logic configured to isolate the input (e.g., NMOS input transistor pair) from the load (e.g., PMOS transistors) of the level shifter 726, which can be beneficial in association with initializing the HV or VHV nodes. In this example, the isolation logic includes the NMOS transistor pair whose gates are configured to receive signal 771-1 (PwrUpLTranVHV). The signal 771-1 can be set to logic low in association with the memory device entering the reduced power mode and to logic high association with exiting the reduced power mode. Control signal 771-2 is the complementary signal to control signal 771-1. As such, signal 771-2 goes high to pull down the output 770 during reduced power mode.

Figure 8A:
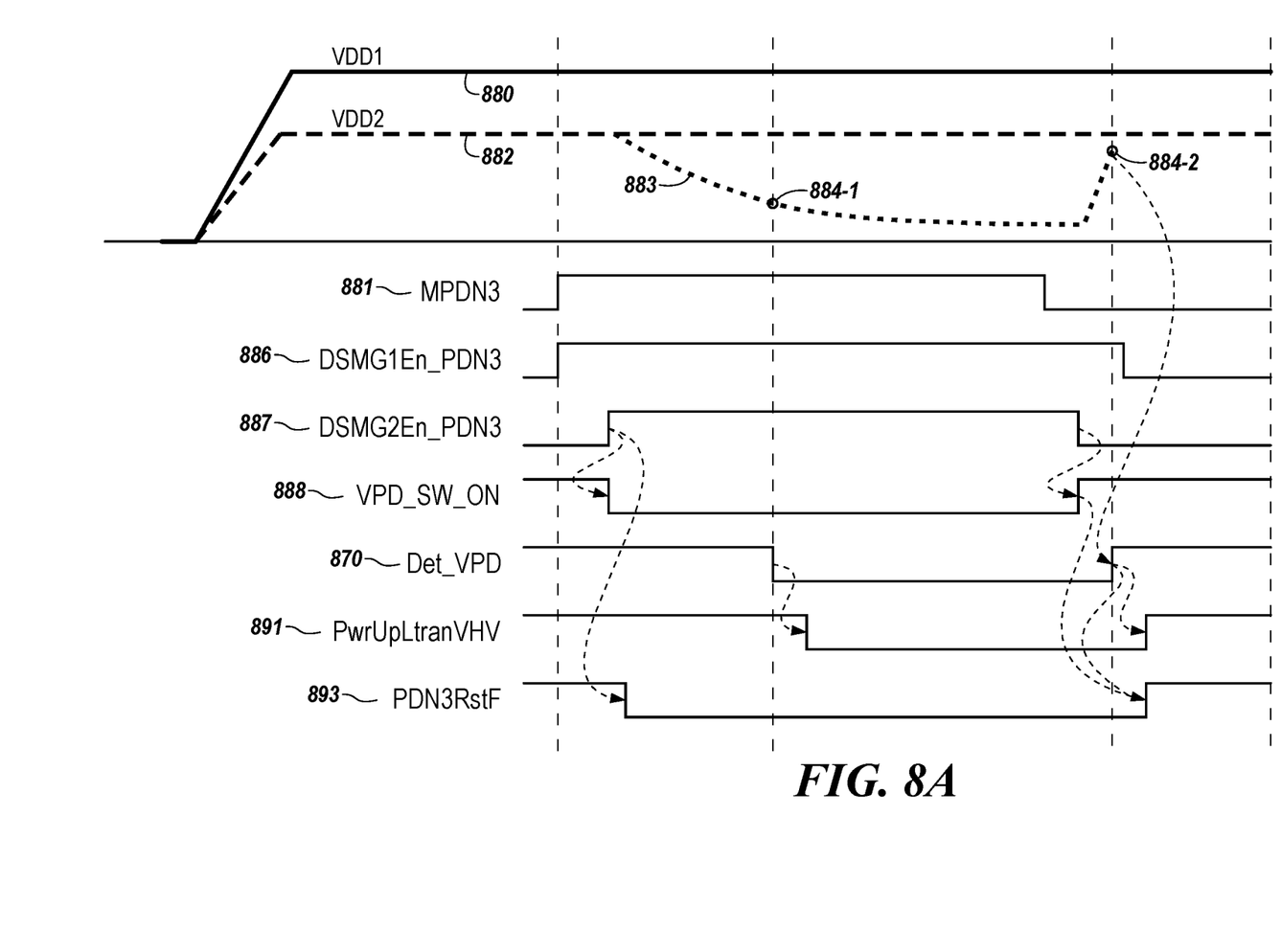
FIG. 8A is a timing diagram associated with entering and exiting a reduced power mode in accordance with a number of embodiments of the present disclosure.
Figure 8B:
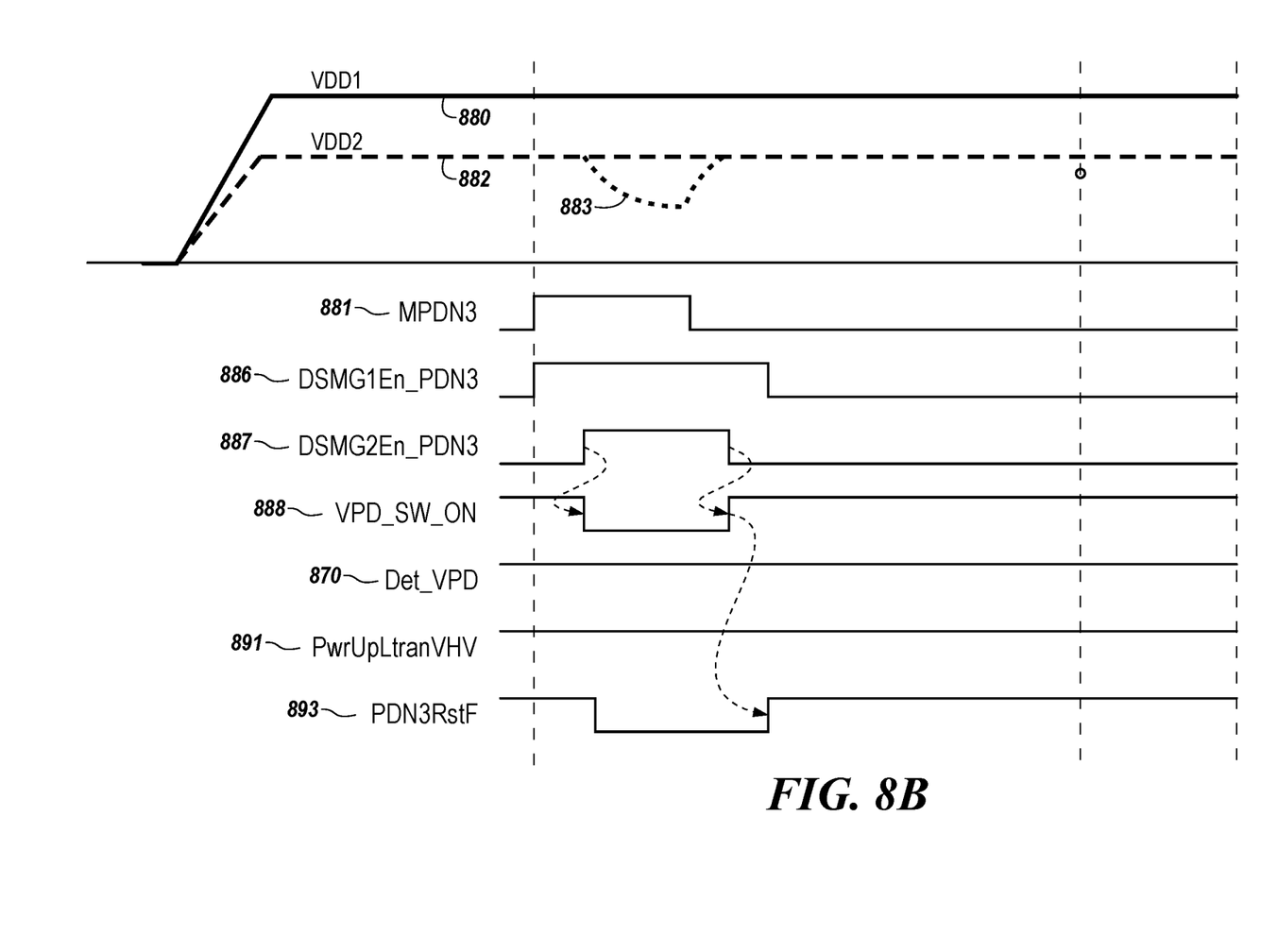
FIG. 8B is a timing diagram associated with entering and exiting a reduced power mode in accordance with a number of embodiments of the present disclosure.

FIGS. 8A and 8B are timing diagrams associated with entering and exiting a reduced power mode in accordance with a number of embodiments of the present disclosure. More specifically, FIG. 8A corresponds to an embodiment in which the floating supply voltage (VPD) 883 reaches the trip point 884-1 of the VPD voltage detector (e.g., detector 124 shown in FIG. 1 or 524 shown in FIG. 5) upon entering the reduced power mode; whereas FIG. 8B corresponds to an embodiment in which the floating supply voltage (VPD) 883 does not reach the trip point 884-1 of the VPD voltage detector upon entering the reduced power mode.

FIGS. 8A and 8B illustrate a power supply voltage signal 880 (VDD1) and a power supply voltage signal 882 (VDD2). The voltages VDD1 and VDD2 may correspond to external supply voltages used to power various components within the memory device (e.g., memory device 100). Although not shown, the external supply voltages can be supplied to various voltage regulators whose outputs are used as internal supply voltages within the memory device. In general, and as shown in FIG. 8A, VDD1 can be greater (in magnitude) than VDD2. As an example, VDD1 can be about 1.8V and VDD2 can be about 1.05V.

The signal 881 (MPDN3) can be a command flag to initiate entry of the memory device into a reduced power mode. The signals 886 (DSMG1En_PDN3) and 887 (DSMG2En_PDN3) are enable signals associated with controlling timing of reduced power mode entry and exit. As shown in FIG. 8A, enable signal 886 rises at the rising edge of signal 881, which indicates initiation of the reduced power mode.

Signal 888 (VPD_SW_ON) is used to enable/disable the switches (e.g., HV or VHV) 122/622 in order to connect or disconnect VPD to VDD2. As shown, a particular time after the rising edge of enable signal 886, enable signal 887 rises, and signal 888 goes low at the rising edge of enable signal 887 to disconnect VDD2 from VPD (e.g., by disabling the switches 122/622 such that signal 883 (VPD) begins floating. A particular time after the falling edge of command flag signal 881, enable signal 887 goes low and signal 888 goes high at the falling edge of signal 887 to reconnect VPD to VDD2 (e.g., by enabling the switches 122/622) such that signal 883 begins recovering at exit time.

In FIGS. 8A and 8B, signal 870 (Det_VPD) corresponds to the monitoring of the floating supply voltage 883 by the VPD voltage detector (e.g., 124/524). A falling edge of signal 870 indicates the VPD voltage detector determined voltage signal 883 reached trip point 884-1 during the reduced power mode (e.g., prior to the rising edge of command flag signal 881). As indicated in FIG. 8A, the VPD signal 883 does reach trip point 884-1 and, as indicated in FIG. 8B, the VPD signal 883 does not reach the trip point 884-1 while the device is in the reduced power mode. Responsive to the falling edge of signal 870, a control signal/flag can be provided to protection logic in order to protect the power domain boundary in accordance with embodiments described herein. For example, a control flag can be provided to the gate 450 of a damper device 441 to prevent a floating signal 434 output from an SCRC driver 440 from being from being driven to a logic component within a different power domain (e.g., a logic component such as an inverter 433 within a valid power domain).

FIGS. 8A and 8B also include a signal/flag 891 (PwrUpLtranVHV) that can be used to protect a level shifter (e.g., 726) to which the VPD voltage detector is coupled as described above. The signal 891 can be controlled by signal 870. For example, as shown in FIG. 8A, signal 891 goes low responsive to the falling edge of signal 870 and returns high responsive to the rising edge of signal 870. As shown in FIG. 8B, signal 891 remains high since the VPD signal 883 does not reach trip point 884-1 (e.g., signal 870 remains high for the duration of the reduced power mode). FIGS. 8A and 8B also illustrate a reset signal 893 (PDN3RstF). The reset signal 893 can be used to reset fuse latches (e.g., 129) associated with bank logic (e.g., 108). As shown in FIG. 8A, the reset signal 893 can go low responsive to the rising edge of enable signal 887 and can return high responsive to the falling edge of enable signal 887 and the rising edge of signal 870.

Figure 9:
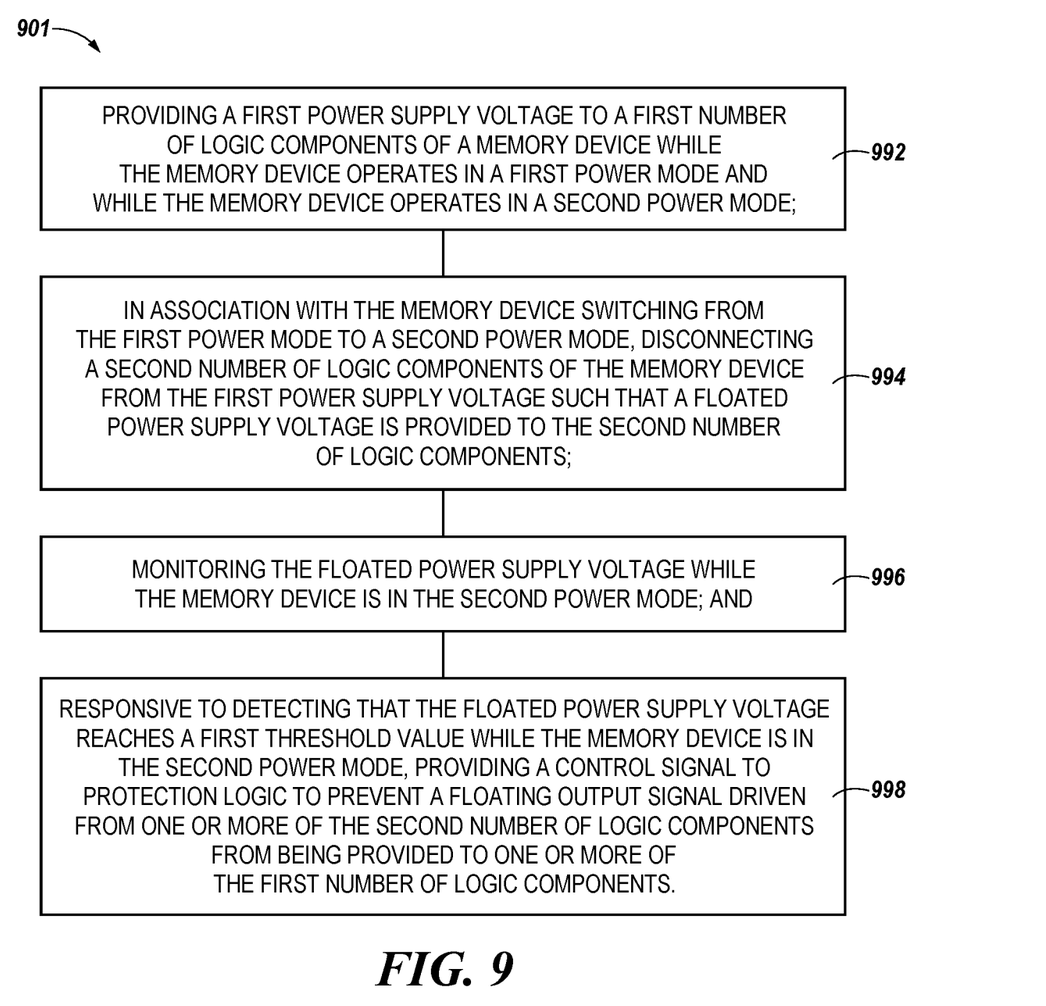
FIG. 9 is a flow diagram illustrating a method for boundary protection in accordance with a number of embodiments of the present disclosure.

FIG. 9 is a flow diagram illustrating a method 901 for boundary protection in accordance with a number of embodiments of the present disclosure. The method 901 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 901 is performed using the bank logic 108 shown in FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 992, the method includes providing a first power supply voltage to a first number of logic components of a memory device while the memory device operates in a first power mode and while the memory device operates in a second power mode. The first power mode can be a non-reduced power mode (e.g., normal operation mode) or a reduced power mode (e.g., one of multiple different reduced power modes associated with a particular memory device). The second power mode can be a power mode associated with a lower device current draw (IDD) than that of the first power mode. For example, the first power mode might be a first reduced power mode having an associated allowed IDD of 5 mA, and the second power mode may be a deep sleep mode having an associated allowed IDD of 0.5 mA. The first power supply voltage can be an external supply voltage (e.g., VDD2) that serves as a valid power source during a reduced power mode. The first number of logic components can include logic components within bank logic of the memory device and/or logic components outside of the memory device bank logic (e.g., peripheral logic such as sense amplifiers and/or error detection/correction circuitry, and/or array core logic).

At block 994, the method includes, in association with the memory device switching from the first power mode to the second power mode, disconnecting a second number of logic components of the memory device from the first power supply voltage such that a floated power supply voltage (e.g., VPD) is provided to the second number of logic components. In a number of embodiments, one or more switches (e.g., switch 622 shown in FIG. 6) can be used to disconnect the second number of logic components from the first power supply voltage in association with entering a reduced power mode. In a number of embodiments, the second number of logic components can comprise latches storing fuse data that is lost when the memory device is in the second (e.g., reduced) power mode. In such embodiments, the fuse information can be updated via a rebroadcast of the fuse information to the latches during exit of the second power mode.

At block 996, the method includes monitoring the floated power supply voltage (e.g., VPD) while the memory device is in the second power mode. The floated power supply voltage can be monitored via a voltage detector such as VPD detector 524 described in FIG. 5.

At block 998, the method includes, responsive to detecting that the floated power supply voltage reaches a first threshold value while the memory device is in the second power mode, providing a control signal to protection logic to prevent a floating output signal driven from one or more of the second number of logic components from being provided to one or more of the first number of logic components. In a number of embodiments, the protection logic can include a single NMOS damper to pull down (e.g., to a ground voltage) a floating output signal driven from SCRC logic in a reduced power supply domain (e.g., 230-1) to a logic component of the first number of logic components in a valid power domain (e.g., 230-2). The gate of the damper transistor can be controlled (e.g., enabled/disabled) based on an indication (e.g., flag) from the VPD voltage detector that the floating supply voltage has reached a threshold value. In a number of embodiments, the protection logic can include a logic gate of a valid power domain configured to receive, as a first input, a floating signal driven from non-SCRC logic in a reduced power supply domain and to receive, as a second input, a protection signal corresponding to an indication from the VPD voltage detector that the floating supply voltage has reached the threshold value.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combinations of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A memory device, comprising:
   a first number of logic components powered by a first power supply voltage while the memory device operates in a first power mode and while the memory device operates in a second power mode; and
   power mode circuitry configured to:
     provide a floated power supply voltage to a second number of logic components by disconnecting the second number of logic components from the first power supply voltage in association with the memory device switching from the first power mode to the second power mode;
     monitor the floated power supply voltage while the memory device is in the second power mode; and
     responsive to detecting that the floated power supply voltage reaches a first threshold value while the memory device is in the second power mode, provide a control signal to protection logic to prevent a floating output signal driven from one or more of the second number of logic components from being provided to one or more of the first number of logic components.

2. The memory device of claim 1, wherein the second number of logic components comprises a sub-threshold current reduction circuitry (SCRC) driver, and wherein the protection logic comprises a damper device coupled to the floating output signal driven by the SCRC driver.

3. The memory device of claim 2, wherein the damper device comprises an NMOS damper having a gate configured to receive the control signal.

4. The memory device of claim 1, wherein the first power supply voltage is an external supply voltage, and wherein the second power mode is a deep sleep mode.

5. The memory device of claim 1, wherein the power mode circuitry comprises:
   a voltage detector powered by, and configured to monitor, the floated power supply voltage; and
   a level shifter powered by the first supply voltage and configured to:
     receive an output signal of the voltage detector; and
     provide detection information to a power domain corresponding to the first number of logic components in association with the memory device entering the second power mode from the first power mode and in association with the memory device exiting the second power mode.

6. The memory device of claim 5, wherein the level shifter comprises isolation logic configured to receive an isolation enable signal in association with the memory device entering the second power mode and an isolation disable signal in association with exiting the second power mode.

7. The memory device of claim 1, wherein the memory device comprises:
a memory array comprising a number of banks; and
bank logic configured to provide control signals to the number of banks; and
wherein the second number of logic components are within the bank logic.

8. The memory device of claim 7, wherein the power mode circuitry is further configured to:
responsive to detecting that the floated power supply voltage does not reach the first threshold value while the memory device is in the second power mode, prevent the control signal from being provided to the protection logic; and
in association with the memory device returning to the first power mode from the second power mode:
reconnect the floated power supply voltage to the first power supply voltage;
detect when the floated power supply reaches a second threshold value; and
responsive to detecting that the floated power supply voltage reaches the second threshold value, disable the protection logic.

9. The memory device of claim 8, wherein the power mode circuitry comprises a plurality of switches used to:
connect a respective plurality of logic components of the second number of logic components to the first power supply voltage in association with returning from the second power mode to the first power mode; and
disconnect the respective plurality of logic components of the second number of logic components from the first power supply voltage in association with entering the second power mode from the first power mode; and
wherein the power mode circuitry is configured to, in association with the memory device returning from the second power mode to the first power mode, stagger enabling of the plurality of switches to reduce a peak current draw on the first power supply voltage.

10. The memory device of claim 1, wherein:
the second number of logic components comprises SCRC logic and non-SCRC logic configured to drive signals to the first number of logic components;
the protection logic to prevent the floating output signal driven from non-SCRC logic of the second number of components from being provided to one or more of the first number of logic components comprises a NAND gate and/or a NOR gate per non-SCRC logic component; and
the protection logic to prevent the floating output signal driven from SCRC logic of the second number of components from being provided to one or more of the first number of logic components comprises only a single damper transistor per SCRC logic component.

11. A method comprising:
providing a first power supply voltage to a first number of logic components of a memory device while the memory device operates in a first power mode and while the memory device operates in a second power mode;
in association with the memory device switching from the first power mode to the second power mode, disconnecting a second number of logic components of the memory device from the first power supply voltage such that a floated power supply voltage is provided to the second number of logic components;
monitoring the floated power supply voltage while the memory device is in the second power mode; and
responsive to detecting that the floated power supply voltage reaches a first threshold value while the memory device is in the second power mode, providing a control signal to protection logic to prevent a floating output signal driven from one or more of the second number of logic components from being provided to one or more of the first number of logic components.

12. The method of claim 11, wherein the method further comprises, for floating output signals driven by sub-threshold current reduction circuit (SCRC) logic of the second number of logic components, utilizing a single damper transistor per floating output signal to pull the floating output signal to a particular voltage, wherein the gate of the damper transistor is controlled by the control signal.

13. The method of claim 12, wherein the method further comprises, for floating output signals driven by non-SCRC logic of the second number of logic components, utilizing at a NAND gate or a NOR gate as protection logic with a first input coupled to the floating output signal and a second input coupled to the control signal.

14. The method of claim 11, wherein the second number of logic components comprises latches storing fuse data that is lost when the memory device is in the second power mode, and wherein the method includes rebroadcasting the fuse information to the latches while the memory device is exiting the second power mode.

15. A memory device, comprising:
a first number of logic components corresponding to a first power domain, the first number of logic components powered by a first power supply voltage while the memory device operates in a first power mode and while the memory device operates in a second power mode; and
a second number of logic components corresponding to a second power domain, the second number of logic components powered by a floating power supply voltage when the memory device is in the second power mode;
a voltage detector configured to monitor the floating power supply when the memory device is in the second power mode, wherein the voltage detector is powered by the floating power supply voltage; and
boundary protection logic configured to, responsive to a determination that the floating power supply voltage has reached a threshold value while the memory device is in the second power mode, prevent a floating output signal driven from one or more of the second number of logic components from being provided to one or more of the first number of logic components in the first power domain.

16. The memory device of claim 15, wherein the second number of logic components are powered by the first power supply voltage when the memory device is in the first power mode, and wherein the memory device comprises a number of switches configured to disconnect the first power supply voltage from the second number of logic components in association with entering the second power mode.

17. The memory device of claim 16, wherein the number of switches are configured to reconnect the first power supply voltage to the second number of logic components in association with returning from the second power mode to the first power mode.

18. The memory device of claim 15, wherein the voltage detector is within the second power domain.

19. The memory device of claim 15, wherein the memory device comprises a number of latches configured to receive fuse data via a rebroadcast operation while the memory device is returning to the first power mode from the second power mode.

20. The memory device of claim 15, wherein the memory device is a ferroelectric random access memory (FeRAM) device.

* * * * *